United States Patent [19]
Amano et al.

[11] Patent Number: 5,547,598
[45] Date of Patent: Aug. 20, 1996

[54] THERMOELECTRIC SEMICONDUCTOR MATERIAL

[75] Inventors: Takashi Amano, Nagoya; Makoto Okabayashi, Anjo, both of Japan

[73] Assignee: Technova, Inc., Tokyo, Japan

[21] Appl. No.: 284,785

[22] Filed: Aug. 2, 1994

[30] Foreign Application Priority Data

Aug. 4, 1993 [JP] Japan .................................. 5-193625

[51] Int. Cl.$^6$ ............................. C22C 38/02; C22C 38/10
[52] U.S. Cl. .................... 252/62.3 T; 252/512; 252/519; 136/239; 428/620; 428/628; 428/641
[58] Field of Search ............................ 252/62.3 T, 512, 252/519; 136/239; 428/620, 628, 641

[56] References Cited

U.S. PATENT DOCUMENTS

| | | | |
|---|---|---|---|
| 3,854,940 | 12/1974 | Hoekje | 420/578 |
| 4,539,054 | 9/1985 | Morimoto et al. | 148/403 |
| 4,755,256 | 7/1988 | Ditchek | 428/620 |
| 4,912,542 | 3/1990 | Suguro | 428/620 |

FOREIGN PATENT DOCUMENTS 4129871  3/1993  Germany .

| | | |
|---|---|---|
| 57-169283 | 10/1982 | Japan . |
| 1194373 | 8/1989 | Japan . |
| 4-35071 | 2/1992 | Japan . |

OTHER PUBLICATIONS

"Temperature Dependence of Semiconducting and structural properties of Cr–Si thin films", J. Appl. Phys. 57 (6), 15 Mar. 1985 pp. 2018–2025.

Primary Examiner—Melissa Bonner
Attorney, Agent, or Firm—Jacobson, Price, Holman & Stern, PLLC

[57] ABSTRACT

A thermoelectric semiconductor material comprises Si crystal and crystal of metal silicide selected from the group consisting of Fe, Co, Cr, Mn and Ni. It is preferable that the metal silicide is $\beta$-$FeSi_2$. Moreover, the thermoelectric semiconductor material further contains at least one element selected from the group consisting of Vb, VIb, IIIb, VIII, VIIa and VIa in the atomic periodic table as an additive. This element can be used as a dopant. Furthermore, since both the phase of the Si crystal and the phase of the crystal of the metal silicide are changed to be an n-type or a p-type, a thermoelectric characteristics are improved.

5 Claims, 1 Drawing Sheet

THERMOELECTRIC SEMICONDUCTOR MATERIAL

BACKGROUND OF THE INVENTION

1. Field of the Invention

The present invention relates to a thermoelectric semiconductor material having thermoelectric conversion ability.

2. Description of the Related Art

In thermoelectric semiconductor material, a p-type or n-type material is connected directly or by way of a metal electrode to be a thermoelectric element. Then, heat energy is directly converted into electric energy (Seebeck effect). Or, an electric current is carried to adsorb and radiate the heat (Peltier effect). This element is used as a thermoelectric conversion device for thermoelectric cooling or thermoelectric generation or a variety of sensor using thermoelectromotive force.

An effective maximum power $P_{max}$ of the thermoelectric conversion element is represented as the following formula:

$$P_{max} = \frac{1}{4} \times S^2 \Delta T^2 / \rho$$

$$= +e, fra / 14 + ee \times E^2 / \rho$$

In this formula, S is Seebeck coefficient, $\rho$ is an effective mean resistivity of the thermoelectric semiconductor material, $\Delta T$ is a temperature difference between a high electrode and a low electrode and E is thermoelectromotive force between a high electrode and a low electrode at the temperature difference $\Delta T$.

Generally, in a thermoelectric conversion element, in order to obtain high conversion efficiency (high effective maximum power), the value of Seebeck coefficient S ($\mu V$/°C) is set to be large. And, the effective mean resistivity $\rho$ and heat conductivity $\kappa$ is set to be small.

It is known that thermoelectric semiconductor material is metal silicide, typically, iron silicide.

The semiconducting iron disilicide ($\beta$-$FeSi_2$) is changed to a p-type material by adding a small amount of Mn or Al. Furthermore the $\beta$-$FeSi_2$ is changed to an n-type material by adding a small amount of Co or Ni.

It is known that the following is effective in order to decrease resistance without deteriorating thermoelectromotive force of the above-mentioned materials, and to improve generating efficiency. In "Abstracts of Japan Ceramics Association 1992, 2A36 (p.162) and 2A37 (p.163)", it is disclosed that Co, Mn and Cr are distributed in a grain boundary of iron silicide. In Japanese Unexamined Patent Publication (KOKAI) No. 169283/1982, it is disclosed that the thermoelectric semiconductor material has a compound structure comprising a metal phase ($\gamma$ phase) of iron silicide and a semiconductor phase ($\beta$ phase).

It is known that a special thermoelectric semiconductor material is FeSiO system material. An ionized cluster beam (ICB) of an oxygen gas is irradiated to iron silicide to make an aggregate comprising iron silicide and amorphous silicon dioxide, thereby improving a thermoelectromotive force. It is disclosed in Japanese Unexamined Patent Publication No. 35071/1992. However, this material is made only as a thin film by ICB or a deposition method. Furthermore, this material has poor reproducibility and poor durability. Therefore, it is difficult to use in practice.

SUMMARY OF THE INVENTION

Concerning the above problems, it is an object of the present invention to provide thermoelectric semiconductor material having a high-performance and new material structure.

A thermoelectric semiconductor material according to the present invention is characterized in that it has compound structure comprising crystal of silicide of a special metal and Si crystal.

The metal of the silicide of the special metal is selected from the group consisting of Fe, Co, Cr, Mn and Ni, the silicide of the metal being preferably $\beta$-$FeSi_2$ or $CoSi_2$.

A composition ratio of the crystal of the metal silicide to the Si crystal is not especially limited on condition that both of these crystals are substantially mixed. The existence of the Si crystal is confirmed by a peak of X-ray diffraction. It is preferable that a volume of the Si crystal is in the range of 30 to 96 volume % when a total volume of the Si crystal and the crystal of the metal silicide is 100 volume %.

It is preferable that the metal silicide acts as the thermoelectric semiconductor.

When the metal silicide is $\beta$-$FeSi_2$, a ratio of a content amount of Si to a content amount of Fe (Si/Fe) is in the range of 3 to 30 in an atomic number ratio.

In the present invention, the Si crystal contained in the thermoelectric semiconductor material has a remarkably high Seebeck coefficient, and also has high resistance. So, in the present invention, the Si crystal is mixed with the crystal of the metal silicide in order to lower the resistance, to maintain high Seebeck coefficient, and to improve an output P. Furthermore, when an appropriate kind and amount of additives are introduced as dopants, it is possible to further decrease the resistance, to maintain high Seebeck coefficient, and to decrease the resistivity $\rho$ of the thermoelectric semiconductor material. At the same time, the Seebeck coefficient can be larger. Therefore, it is possible to maintain high thermoelectromotive force E, thereby improving the output P.

It is possible that the thermoelectric semiconductor material according to the present invention contains at least one element selected from the group consisting of Vb, VIb, IIIb, VIII, VIIa and VIa in atomic periodic table as additives. It is preferable that the additive is selected from the group consisting of P, As, Sb, S, B, Co, Ni, Mg and Cr, more preferably, only P. Especially, when the metal silicide is iron disilicide, it is preferable that the additive is P and Co.

The additive acts as an impurity (a dopant) in an ordinary semiconductor technical field. In the present invention, the additive acts as a p-type or n-type dopant because of a relative difference between a valence of a composition element in the thermoelectric semiconductor in which the impurity is dissolved and a valence of an element of the impurity.

BRIEF DESCRIPTION OF THE DRAWINGS

A more complete appreciation of the present invention and many of its advantages will be readily obtained as the same becomes better understood by reference to the following detailed description when considered in connection with the accompanying drawings and detailed specification, all of which forms a part of the disclosure.

DETAILED DESCRIPTION OF THE PREFERRED EMBODIMENTS

Figure 1:
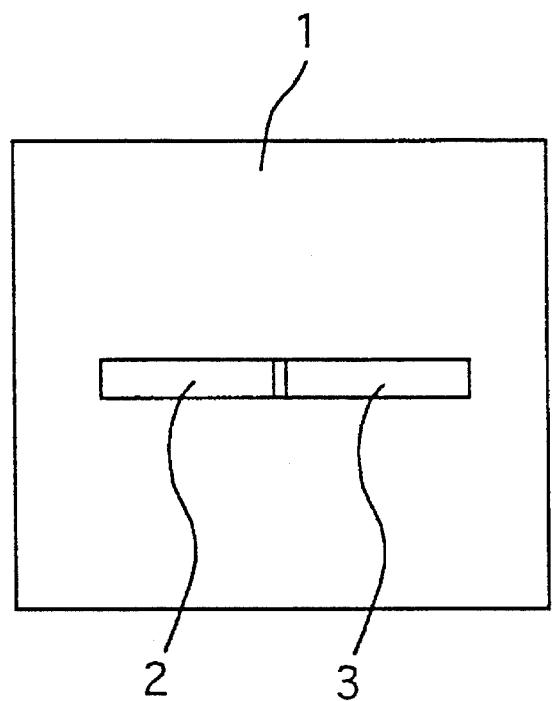
FIG. 1 is a plan view for showing a thermopile sensor which is used for an adhesion test.

Having generally described the present invention, a further understanding can be obtained by reference to the specific preferred embodiments which are provided herein for purposes of illustration only and are not intended to limit the scope of the appended claims.

The Preferred Embodiments according to the present invention will be hereinafter described.

X-ray peak strength and the thermoelectric characteristics at the temperature difference of 800° C.

TABLE 1

| Component ($Fe_1Si_yP_x$) | | X-ray Peak Strength | | | Thermoelectric Characteristics | | |
|---|---|---|---|---|---|---|---|
| | | | | | Thermo-electomotive force | Effective Mean Resistivity | Effective Maximum Power |
| X | Y | Si | β-FeSi$_2$ | Si/β-FeSi$_2$ | (mv) | (Ωcm) | (Wcm/cm$^2$) |
| 0.05 | 2.5 | 25 | 75 | 0.33 | −33.8 | 0.12 | 0.005 |
| | 6.6 | 29 | 71 | 0.41 | −193.4 | 0.059 | 0.16 |
| | 8.2 | 47 | 53 | 0.89 | −193.3 | 0.034 | 0.27 |
| 0.08 | 2.6 | 12 | 88 | 0.14 | −89.7 | 0.113 | 0.012 |
| | 4.0 | 47 | 53 | 0.89 | −172.0 | 0.009 | 0.80 |
| | 4.7 | 39 | 61 | 0.64 | −172.0 | 0.012 | 0.60 |
| 0.20 | 2.8 | 15.5 | 84.5 | 0.183 | −69.0 | 0.059 | 0.020 |
| | 8.6 | 59.4 | 40.6 | 1.46 | −177.0 | 0.0076 | 1.032 |
| | 14.2 | 72.6 | 27.4 | 2.65 | −169.0 | 0.006 | 1.182 |
| | 27.5 | 79.0 | 21.0 | 3.76 | −219.0 | 0.0137 | 0.879 |
| 0.05 | 2.2 | 0 | 100.0 | 0 | −1.0 | 0.033 | 0.000 |
| 0.08 | 2.6 | 0 | 100.0 | 0 | −18.0 | 0.147 | 0.001 |
| 0.20 | 2.3 | 0 | 100.0 | 0 | −59.0 | 0.052 | 0.017 |

First Preferred Embodiment

In the First Preferred Embodiment, an FeSiP system thermoelectric semiconductor material was prepared as follows.

In an experimental formula, $Fe_1Si_yP_x$, when a content amount X of P was fixed and an added amount Y of Si was changed, a thin film of the thermoelectric semiconductor material of the present invention was formed. Then, thermoelectric characteristics were evaluated.

The thin film was formed by a ternary sputtering method as follows. A film formation speed of three targets, $FeSi_2$, Si and $Fe_3P$, was controlled, and an introduced value of each element was determined. The added amount X of P was set to be always constant for Fe by fixing a film formation speed ratio of each target, $FeSi_2$ and $Fe_3P$, to be constant value. The added amount Y of Si was adjusted by controlling the film formation speed of Si. After the film formation, a heat treatment was performed at the temperature of 760° C. for 5 hours in vacuum.

A substrate was prepared as follows. $SiO_2$ was laminated on the surface of an alumina substrate to have a thickness of about 0.3 micron by a sol/gel method. As a result, the surface of the alumina substrate was smoothed.

Concerning the thermoelectric characteristics, the electromotive force, the effective mean resistivity and the effective maximum power were measured by a direct current method. The highest temperature at a high-temperature electrode was 880° C., and the temperature of a low-temperature electrode was maintained to be always not more than 40° C.

The thickness of the thin film was about 1 micron.

The ratio of the content amount of Si to the content amount of Fe (atomic number ratio) was determined by a fluorescent X-ray analysis method on the basis of a reference standard by an ICP analysis. The added amount of P was converted by the film formation speed.

Table 1 shows the component of each sample, the volume % of the Si crystal and β-FeSi$_2$ which were calculated by a The Si crystal for constituting the thermoelectric semiconductor material in Table 1 became a n-type due to an effect of adding β-FeSi$_2$ also became a n-type, but the thermoelectromotive force is small. In this embodiment, when the added amount X of P was set to be 0.08 or 0.2, the ratio of the Si crystal to the crystal of β-FeSi$_2$ (Si/ β-FeSi$_2$) could be in the range of 0.6 to 4. Furthermore, it was possible to increase the effective maximum power.

The thermoelectric material in which the X-ray peak of the Si crystal was not found ($FeSi_{2.2}P_{0.05}$, $FeSi_{2.6}P_{0.08}$ and $FeSi_{2.3}O_{0.20}$ having β-FeSi$_2$ single phase) showed remarkably small effective maximum power.

Second Preferred Embodiment

In the Second Preferred Embodiment, a FeSiCoP system thermoelectric semiconductor material was prepared as follows.

In this embodiment, the experimental formula was regulated as $Fe_1Si_yCo_zP_x$, and $Fe_{0.8}Co_{0.2}Si_2$ was substituted for $FeSi_2$ as target, and Co was introduced. The thin film was formed on the surface of the substrate in the same manner as that of the First Preferred Embodiment except that the above condition.

Table 2 shows the component of each sample, the volume % of the Si crystal and β-FeSi$_2$ which were calculated by a X-ray peak strength and the thermoelectric characteristics at the temperature difference of 800° C.

In this embodiment, due to the introduction of Co, the thermoelectric characteristics of the crystal of β-FeSi$_2$ were improved as compared with the crystal of β-FeSi$_2$ containing no Co. The Si crystal containing P has high thermoelectric characteristics so that the thermoelectric semiconductor material in this embodiment was considered to have high effective maximum power.

$FeSi_{2.1}Co_{0.7}$ and $FeSi_{2.3}Co_{0.07}P_{0.08}$ having β-FeSi$_2$ single phase, typical samples of prior art, showed a relatively low effective maximum power of 0.87. The reason of this was considered that they comprised no mixed phase of the Si crystal. However, $FeSi_{2.1}Co_{0.7}$ and $FeSi_{2.3}Co_{0.07}P_{0.08}$ having the $\beta$-$FeSi_2$ single phase and containing P in the Second Preferred Embodiment had higher effective maximum power than $FeSi_{2.2}P_{0.05}$, $FeSi_{2.6}P_{0.08}$ and $FeSi_{2.3}P_{0.20}$ having the $\beta$-$FeSi_2$ single phase in the First Preferred Embodiment. The reason of this was judged that the thermoelectric characteristics of $\beta$-$FeSi_2$ single phase was improved due to the introduction of Co.

TABLE 2

| Component ($Fe_1Si_yCo_2P_x$) | | | X-ray Peak Strength | | | Thermoelectric Characteristics | | |
|---|---|---|---|---|---|---|---|---|
| | | | | | | Thermo-electromotive force | Effective Mean Resistivity | Effective Maximum Power |
| x | y | z | Si | $\beta FeSi_z$ | Si/$\beta FeSi_z$ | (mv) | ($\Omega$cm) | (Wcm/cm$^2$) |
| 0.08 | 4.5 | 0.05 | 37.3 | 62.7 | 0.59 | −186 | 0.0074 | 1.17 |
| | 4.8 | 0.07 | 33.8 | 66.2 | 0.51 | −165 | 0.0055 | 1.24 |
| | 5.3 | 0.147 | 49.3 | 50.7 | 0.97 | −137 | 0.0044 | 1.05 |
| 0 | 2.1 | 0.07 | 0 | 100 | 0 | −141 | 0.0057 | 0.87 |
| 0.08 | 2.3 | 0.07 | 0 | 100 | 0 | −155 | 0.0162 | 0.37 |

Third Preferred Embodiment

In the Third Preferred Embodiment, the experimental formula was regulated as $FeSi_yMn_zB_x$, and $FeSi_2$ and Si targets were used. B was introduced by using $Fe_2B$ targets which is one of the compounds comprising Fe and B, and Mn was introduced by substituting $Fe_{0.8}Mn_{0.2}Si_2$ for $FeSi_2$. The thin film was formed on the surface of the substrate in the same manner as that of the First Preferred Embodiment except that the above condition.

Table 3 shows the component of each sample, the volume % of the Si crystal and $\beta$-$FeSi_2$ which were calculated by a X-ray peak strength and the thermoelectric characteristics at the temperature difference of 800° C.

Figure 2:
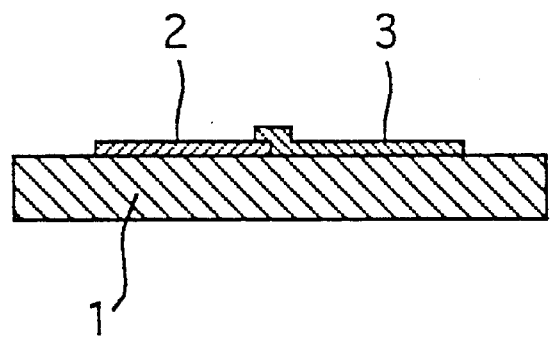
FIG. 2 is a cross-sectional view for showing a thermopile sensor which is used for an adhesion test.

The thermoelectric semiconductor material in this embodiment became a p-type due to the introduction of Mn and B. The thermoelectric semiconductor material in this embodiment, $FeSi_{9.89}Mn_{0.17}B_{0.39}$ showed the effective maximum power of 0.89. On the contrary, a thermoelectric semiconductor material ($\beta$-$FeSi_2$ single phase), $FeSi_{3.00}Mn_{0.076}$, which is a typical sample of prior art, showed the effective maximum power of 0.73.

mixed phase comprising the Si crystal and $\beta$-$FeSi_2$) and the conventional thermoelectric conductor materials ($FeSi_{2.1}Co_{0.07}$ and $FeSi_{3.00}Mn_{0.076}$ having the $\beta$-$FeSi_2$ single layer) were used to make a thermoelectric element in which a n-type thermoelectric semiconductor 2 was combined with a p-type thermoelectric semiconductor 3 on a substrate 1 as shown in FIGS. 1 and 2. Two kinds of Si wafers were used as the substrate 1: one had a metal Si surface without a thermal oxidation film, a thickness of 0.25 mm and an orientation of (100), and the other had a thermal oxidation film whose thickness was 1 micron and an orientation of (100).

Concerning each thermoelectric semiconductor material, a film having the thickness of 1 micron was formed by the sputtering method which was the same as that of the Second and Third Preferred Embodiments. Each thermoelectric semiconductor material was processed to be in three micro lines by a dry etching or a lift off to which a photo lithography technology was applied: one had the width of 10 microns and the length of 2.5 mm, another had the width of 100 microns and the length of 2.5 mm and the other had the width of 1000 microns and the length of 2.5 mm. There was no problem in the above processing of each thermoelectric semiconductor material.

An adhesion test was performed by the heat treatment at the temperature of 760° C. for 5 hours in vacuum. This heat treatment was the same as that of the Preferred Embodiments.

In this adhesion test, no peeling or crack was found in each thermoelectric semiconductor material which was formed on the substrate having the metal Si surface without

TABLE 3

| Component ($FeSi_yMn_zB_x$) | | | X-ray Peak Strength | | | Thermoelectric Characteristics | | |
|---|---|---|---|---|---|---|---|---|
| | | | | | | Thermo-electromotive force | Effective Mean Resistivity | Effective Maximum Power |
| x | y | z | Si | $\beta FeSi_z$ | $MnSi_{1.70}$ | (mv) | ($\Omega$cm) | (Wcm/cm$^2$) |
| 0.39 | 9.89 | 0.170 | 40 | 60 | 0 | 0.179 | 0.009 | 0.89 |
| 0 | 3.00 | 0.076 | 0 | 100 | 0 | 0.171 | 0.010 | 0.73 |

(Concerning processability and adhesion)

Concerning the thermoelectric conductor material, in order to observe a micro wire processability and an adhesion to the substrate, each thermoelectric conductor material obtained in the Second and Third Preferred Embodiments ($FeSi_{4.8}Co_{0.07}P_{0.08}$ and $FeSi_{9.89}Mn_{0.17}B_{0.39}$ having the the thermal oxidation film. On the contrary, concerning the thermoelectric semiconductor material which was formed on the thermal oxidation film on the substrate, some peelings were found in $FeSi_{2.1}Co_{0.07}$ and $FeSi_{3.00}Mn_{0.076}$ having $\beta$-$FeSi_2$ single layer. These peeling were caused by an internal stress of a crystallization of the film. However, in case of $FeSi_{4.8}Co_{0.07}P_{0.08}$ and $FeSi_{9.89}Mn_{0.17}B_{0.39}$ according to the present invention, no peeling or crack was found in both substrates.

Thus, the thermoelectric semiconductor material according to the present invention can be processed to be in the micro line on the Si wafer, so it is suitable for use as a micro thermopile sensor.

In the thermoelectric semiconductor material according to the present invention, the Si crystal phase is mixed with the crystal phase of the metal silicide, so it is possible to show the thermoelectric characteristics which are not obtained by the thermoelectric semiconductor material having $\beta$-FeSi$_2$ single phase. Furthermore, it is possible to decrease the effective mean resistivity $\rho$, and to larger the Seebeck coefficient S. Therefore, it is possible to maintain the thermoelectromotive force E to be high, and as a result, to improve the effective maximum power P.

Having now fully described the present invention, it will be apparent to one of ordinary skill in the art that many changes and modifications can be made thereto without departing from the spirit or scope of the present invention as set forth herein including the appended claims.

What is claimed is:

1. Thermoelectric semiconductor material comprising Si crystal and crystal of semiconductive metal silicide, wherein said semiconductive metal silicide is $\beta$-FeSi$_2$, and
   an atomic number ratio of Si to Fe is in the range of from 3 to 30.

2. Thermoelectric semiconductor material comprising Si crystal and crystal of semiconductive metal silicide, wherein said semiconductive metal silicide is $\beta$-FeSi$_2$, and
   said Si crystal is in a range of from 30 to 96 volume % based on a total volume of said Si crystal and said crystal of said semiconductive metal silicide as 100 volume %.

3. Thermoelectric semiconductor material according to claim 1, further containing P, or P and Co as an additive.

4. Thermoelectric semiconductor material according to claim 1, further containing Mn and boron as an additive.

5. Thermoelectric semiconductor material according to claim 2 wherein an atomic number ratio of Si to Fe is in the range of from 3 to 30.

* * * * *